(12) United States Patent
Yamazaki et al.

(10) Patent No.: US 10,383,234 B2
(45) Date of Patent: Aug. 13, 2019

(54) MOLDING WITH INTEGRATED ELECTRODE PATTERN AND METHOD FOR MANUFACTURING SAME

(71) Applicant: NISSHA CO., LTD., Kyoto-shi (JP)

(72) Inventors: Seiichi Yamazaki, Kyoto (JP); Toshihiro Iga, Kyoto (JP); Yasuisa Takinishi, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 15/749,683

(22) PCT Filed: May 1, 2017

(86) PCT No.: PCT/JP2017/017148
§ 371 (c)(1),
(2) Date: Feb. 1, 2018

(87) PCT Pub. No.: WO2017/212832
PCT Pub. Date: Dec. 14, 2017

(65) Prior Publication Data
US 2018/0228032 A1    Aug. 9, 2018

(30) Foreign Application Priority Data

Jun. 9, 2016   (JP) ................................ 2016-115529

(51) Int. Cl.
*H05K 1/11* (2006.01)
*H05K 1/02* (2006.01)
(Continued)

(52) U.S. Cl.
CPC ......... *H05K 3/32* (2013.01); *B29C 45/14016* (2013.01); *B29C 45/14467* (2013.01);
(Continued)

(58) Field of Classification Search
CPC .. H05K 3/32; H05K 1/028; H05K 2203/1327; H05K 3/0014; H05K 1/115;
(Continued)

(56) References Cited

U.S. PATENT DOCUMENTS

2010/0193939 A1   8/2010  Taguchi et al.
2010/0271265 A1* 10/2010  Sung ................. B29C 45/14065
                                           343/700 MS
(Continued)

FOREIGN PATENT DOCUMENTS

JP           63-99558 A    4/1988
JP           3-61372 U     6/1991
(Continued)

OTHER PUBLICATIONS

International Search Report dated Jul. 18, 2017 in PCT/JP2017/017148 filed May 1, 2017.

*Primary Examiner* — Ishwarbhai B Patel
(74) *Attorney, Agent, or Firm* — Xsensus LLP (57) ABSTRACT

A molding with an integrated electrode pattern, including a resin molded body having a first surface and a second surface opposing each other; a first film that is formed on the first surface and that includes an electrode pattern and a first lead-out wire electrically connected to the electrode pattern, the first film not being covered by the resin molded body; and a second film that stands on the first surface, and that includes a second lead-out wire electrically connected to the first lead-out wire, the second film having a rectangular shape, and the resin molded body includes a pair of support wall portions formed integrally with the first surface so as to stand on the first surface and clamp both ends of a base part of the second film.

8 Claims, 9 Drawing Sheets

(51) Int. Cl.
   *B29C 45/14*    (2006.01)
   *B32B 27/08*    (2006.01)
   *H05K 3/32*     (2006.01)
   *H05K 3/00*     (2006.01)
   *H05K 1/18*     (2006.01)
   *B29C 70/72*    (2006.01)
   *B29L 31/34*    (2006.01)

(52) U.S. Cl.
   CPC .............. *B32B 27/08* (2013.01); *H05K 1/115* (2013.01); *H05K 3/0014* (2013.01); *B29C 45/14* (2013.01); *B29C 70/72* (2013.01); *B29C 2045/1454* (2013.01); *B29C 2045/14147* (2013.01); *B29C 2045/14163* (2013.01); *B29C 2045/14532* (2013.01); *B29K 2995/0007* (2013.01); *B29L 2031/34* (2013.01); *B32B 2307/206* (2013.01); *B32B 2457/00* (2013.01); *H05K 1/028* (2013.01); *H05K 1/0284* (2013.01); *H05K 1/189* (2013.01); *H05K 2201/09209* (2013.01); *H05K 2203/1327* (2013.01)

(58) Field of Classification Search
   CPC .. H05K 2201/09209; B29K 2995/0007; B32B 2307/206; B32B 2457/00; B32B 27/08; B29L 2031/34; B29C 45/14016; B29C 45/14467; B29C 2045/14163; B29C 2045/14147; B29C 2045/14532; B29C 2045/1454

See application file for complete search history.

(56) References Cited

U.S. PATENT DOCUMENTS

| | | | |
|---|---|---|---|
| 2014/0016048 A1* | 1/2014 | Omote | G06F 3/044 349/12 |
| 2014/0043771 A1* | 2/2014 | Isoda | H05K 7/02 361/728 |
| 2015/0103503 A1* | 4/2015 | Yamazaki | H01R 4/04 361/757 |

FOREIGN PATENT DOCUMENTS

| | | |
|---|---|---|
| JP | 2010-182773 A | 8/2010 |
| JP | 2012-11691 A | 1/2012 |
| WO | 2013/180132 A1 | 12/2013 |

* cited by examiner

MOLDING WITH INTEGRATED ELECTRODE PATTERN AND METHOD FOR MANUFACTURING SAME

TECHNICAL FIELD

The present invention relates to a molding with an integrated electrode pattern for use in, for example, a display panel of an electric home appliance, a vehicle-mounted audio device, a window panel of a cellular phone, a display or a mouse of a personal computer, an operation panel or a remote control of any type of household appliance, or a display of a game device. The present invention also relates to a method for manufacturing the molding with an integrated electrode pattern.

BACKGROUND ART

One known method for fixing an FPC to a resin molded body is to fix the FPC to an inner surface of the resin molded body by forming projections at both end portions of the FPC in the width direction (see, for example, PTL 1).

CITATION LIST

Patent Literature

PTL 1: Japanese Unexamined Patent Application Publication No. 63-98194

SUMMARY OF INVENTION

Technical Problem

However, the above-described structure has a problem that the FPC is easily separated from the inner surface of the resin molded body when a pulling force is applied to a connector because the FPC is simply placed between the inner surface of the resin molded body and the projections.

Accordingly, an object of the present invention is to solve the above-described problem and to provide a molding with an integrated electrode pattern in which a lead terminal can be strongly connected to an inner surface of a resin molded body and a method for manufacturing the molding with an integrated electrode pattern.

Solution to Problem

To achieve the above-described object, the present invention provides a molding with an integrated electrode pattern including:

a resin molded body;

a first film that is formed on an inner surface of the resin molded body and that includes an electrode pattern and a first lead-out wire electrically connected to the electrode pattern; and a second film that is band-shaped, that stands on the inner surface of the resin molded body, and that includes a second lead-out wire electrically connected to the first lead-out wire.

The resin molded body includes a pair of support wall portions formed integrally with the inner surface of the resin molded body so as to stand on the inner surface of the resin molded body and clamp both ends of a base part of the second film.

To achieve the above-described object, the present invention also provides a method for manufacturing a molding with an integrated electrode pattern including the steps of:

positioning a first film on a surface of a first injection molding die that defines a cavity for forming a resin molded body made of a molded resin, and placing a band-shaped second film in a second-film receiving recess, which is provided apart from the cavity in the first injection molding die, while the first injection molding die and a second injection molding die are in an open state, the first film including an exposed adhesive layer for fixing a first lead-out wire, which is electrically connected to a second lead-out wire of the second film, and an electrode pattern, which is electrically connected to the first lead-out wire, to the resin molded body;

clamping the first injection molding die and the second injection molding die together;

injecting molten resin into the cavity as well as an outer-wall recess and inner-wall recesses, which are connected to the cavity and arranged in a region where the second-film receiving recess is connected to the cavity at positions corresponding to both end portions of a base part of the second film, and cooling and solidifying the molten resin, thereby forming a pair of support walls integrally with the resin molded body at both end portions of the base part of the second film as well as fixing the first film to the resin molded body with the adhesive layer, embedding the first lead-out wire, the electrode pattern, and a connecting portion between the second lead-out wire of the second film and the first lead-out wire in the resin molded body, and exposing a portion of the second film other than the connecting portion to outside of the resin molded body; and removing the molding with an integrated electrode pattern including the second film, the first film, and the resin molded body from the cavity between the first and second injection molding dies.

Advantageous Effects of Invention

According to the present invention, both end portions of the base part of the second film (lead terminal), which extends from the resin molded body, can be clamped by the pair of support wall portions that are formed integrally with the resin molded body so as to stand on the inner surface of the resin molded body. Thus, the lead terminal can be securely fixed to the inner surface of the resin molded body. In addition, according to the present invention, the molding with an integrated electrode pattern can be easily and reliably manufactured.

DESCRIPTION OF EMBODIMENTS

A first embodiment of the present invention will now be described in detail with reference to the drawings.

As illustrated in FIGS. 1A to 1E, a molding 1 with an integrated electrode pattern according to the first embodiment of the present invention includes at least a resin molded body 2 made of a molded resin, a band-shaped lead terminal 4, and a pair of support wall portions 3.

The resin molded body 2 made of a molded resin is made of, for example, an insulating resin material, such as a polycarbonate (PC) resin, an ABS resin, a PET resin, or an acrylic resin. A sensor film 6, which functions as an example of a first film, is fixed to the inner surface of the resin molded body 2 in an injection molding process. The sensor film 6 includes electrode patterns 13 and first lead-out wires 63 for the electrode patterns 13 on a base film 11.

The band-shaped lead terminal 4 functions as an example of a second film, and includes second lead-out wires 15 arranged on a band-shaped base film portion 11a and electrically connected to the first lead-out wires 63. The lead terminal 4 extends from the resin molded body 2 in a direction away from the resin molded body 2. The lead terminal 4 is formed integrally with the sensor film 6. In this case, the first lead-out wires 63 and the second lead-out wires 15 are preferably made of the same material and formed simultaneously.

Figure 1A:
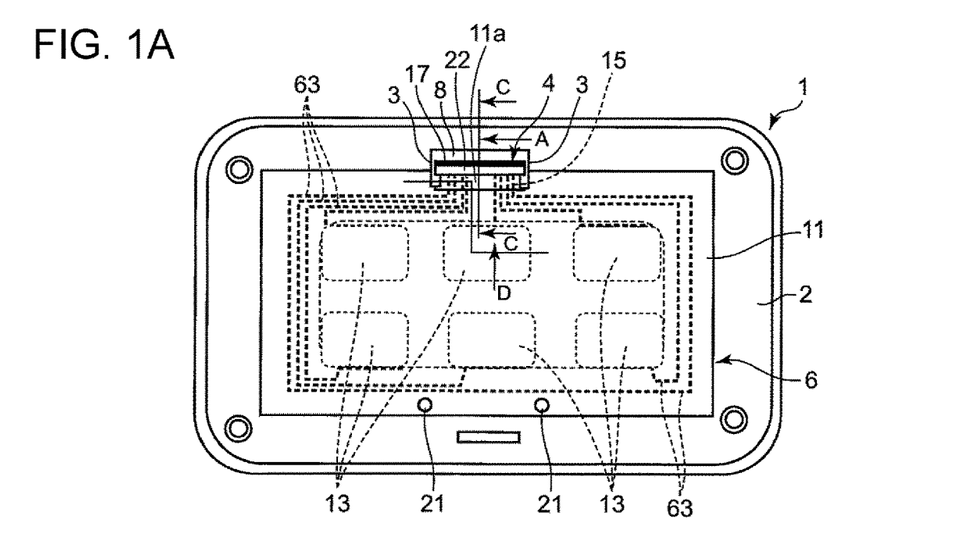
FIG. 1A is a plan view of a molding with an integrated electrode pattern according to a first embodiment of the present invention.
Figure 1B:
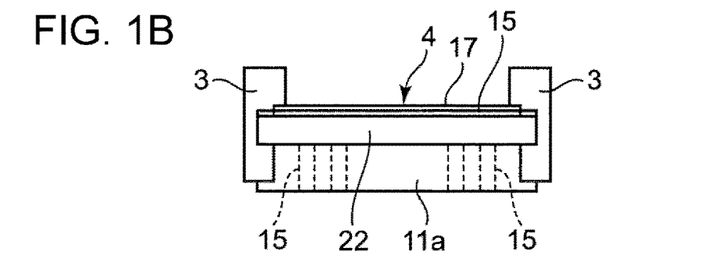
FIG. 1B is an enlarged plan view illustrating the minimum required components, which are a pair of support walls, of the molding with an integrated electrode pattern illustrated in FIG. 1A.

The pair of support wall portions 3 are formed integrally with the resin molded body 2 so as to stand on the inner surface of the resin molded body 2 substantially perpendicularly to the inner surface. As illustrated in FIG. 1B, the support wall portions 3 support both end portions of a base part 4a of the lead terminal 4, which extends from the resin molded body 2, so that each end portion is retained in three directions, that is, from the front, back, and one side of the end portion and that the base part 4a stands upright.

Figure 1C:
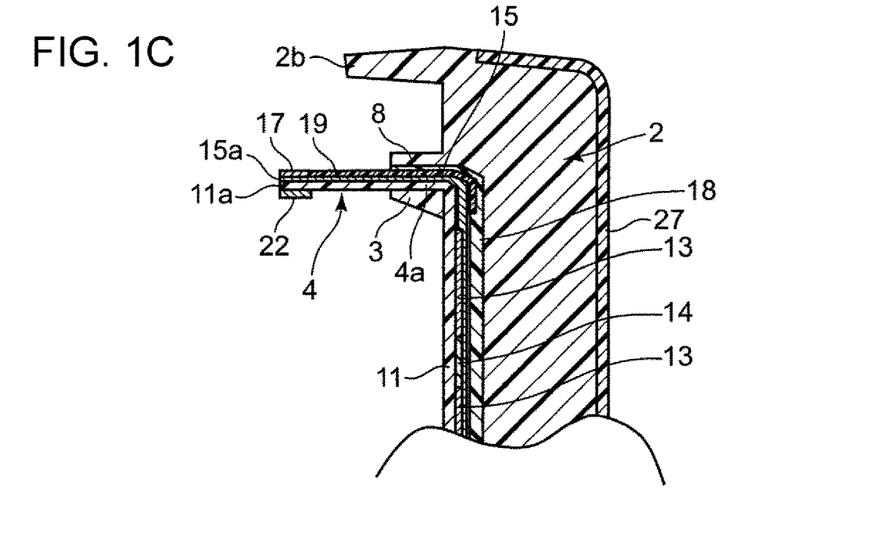
FIG. 1C is a sectional view of the molding with an integrated electrode pattern according to the first embodiment taken along line C-C in FIG. 1A.

More specifically, the sensor film 6, which is substantially rectangular, is embedded in the inner surface of the resin molded body 2 in the injection molding process. The sensor film 6 includes the electrode patterns 13 including, for example, an electrostatic sensor pattern or an antenna pattern, the first lead-out wires 63, and the second lead-out wires 15 of the lead terminal 4. FIG. 10 is a sectional view illustrating an example of the structure of the sensor film 6. The sensor film 6 includes a base film 11, a primer layer 12 provided as necessary, the electrode patterns 13 including PEDOT electrodes, the first lead-out wires 63 electrically connected to the electrode patterns 13, a frame pattern 14 provided as necessary, a graphic layer 16 provided as necessary, a carbon ink layer 17, an adhesive layer 18, an overcoat layer 19 and/or reinforcing film 20, and a reinforcing plate 22.

The base film 11 is embedded in the inner surface of the resin molded body 2 so as to be flush with the inner surface. The base film 11 may be formed of, for example, polyimide, polycarbonate, polyethylene terephthalate (PET), an acrylic film, or a composite film obtained by laminating an acrylic film and a polycarbonate film.

An electrostatic sensor pattern is formed on a surface of the base film 11 that faces the resin molded body 2.

The electrode patterns 13 and the first lead-out wires 63 are printed by using ink made of silver, copper, carbon, or a mixture thereof. The electrode patterns 13 and the first lead-out wires 63 may instead be printed by using ink containing a conductive polymer made of, for example, PEDOT/PSS [poly(3,4-ethylenedioxythiophene) (PEDOT) and polystyrene sulfonic acid (PSS)] as a base material. Alternatively, the electrode patterns 13 and the first lead-out wires 63 may be formed by patterning an electrode solid layer made of a silver mesh, a copper mesh, or carbon nanotube (CNT) by, for example, laser etching. When, for example, the electrode patterns 13 and the first lead-out wires 63 are made of PEDOT/PSS and included in a transparent window of an LCD, gaps between the electrode patterns are clearly visible because PEDOT/PSS is blue, and such an LCD does not have a good appearance. In such a case, the frame pattern 14 that is substantially positioned so as to cover the gaps between the electrode patterns may be printed by using a non-conductive ink having a blue color similar to that of PEDOT/PSS. Thus, the gaps between the electrode patterns 13 and the first lead-out wires 63 may be covered and made less visible.

The electrode patterns 13, the first lead-out wires 63, and the second lead-out wires 15 may be made of the same material.

The primer layer 12 may be provided as necessary to increase the adhesion of the electrode patterns 13 and the first lead-out wires 63 to the base film 11.

The graphic layer 16 is formed as necessary on the base film 11, the primer layer 12, or the electrode patterns 13 and the first lead-out wires 63.

The second lead-out wires 15, which are electrically connected to the first lead-out wires 63, are formed on the base film portion 11*a* or the primer layer 12.

A surface of the sensor film 6 at the side opposite the base film 11 may be covered with the adhesive layer 18 over an area excluding the lead terminal 4. The sensor film 6 is bonded to the resin molded body 2 by the adhesive layer 18 in the injection molding process.

Figure 1D:
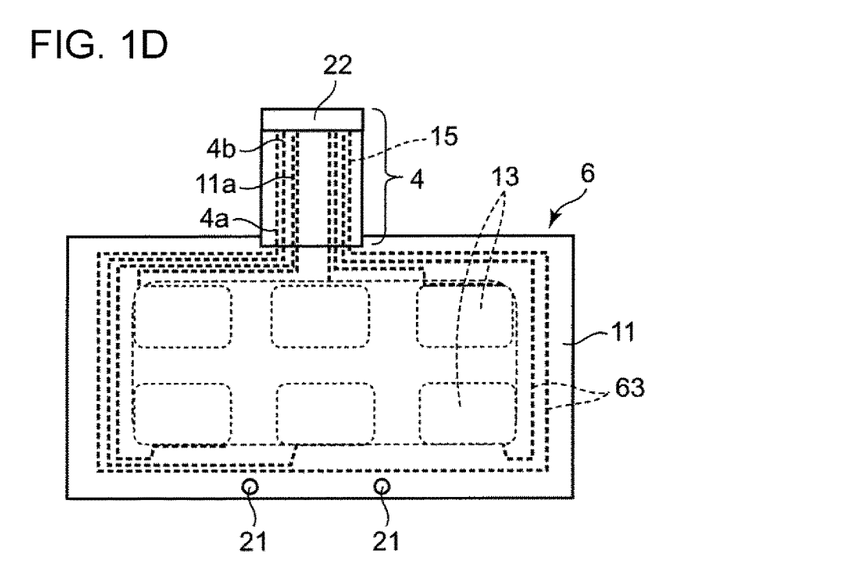
FIG. 1D is a plan view of a sensor film included in the molding with an integrated electrode pattern.

As illustrated in FIG. 1D, the base film 11 extends from a portion of a long side of the substantially rectangular sensor film 6, and the band-shaped lead terminal 4 is formed integrally therewith. The lead terminal 4 extends in a direction away from the resin molded body 2.

A pair of positioning through holes 21 having a predetermined interval therebetween are formed in the substantially rectangular sensor film 6 at a long side that opposes the long side at which the band-shaped lead terminal 4 is provided. The positioning through holes 21 are used to position the sensor film 6 with respect to a die (die 41 described below) in the injection molding process.

As illustrated in FIG. 10, a design film 27, for example, is formed on the outer surface of the resin molded body 2. The design film 27 is a film on which, for example, a pattern representing an operation function, such as an on/off button or a slider switch, or an appearance design pattern is formed. The design film 27 may be of a type such that an outermost base film is removed after the injection molding process or a type such that the outermost base film is not moved and is used as a part of a product.

The lead terminal 4 extends from a central portion of a long side of the sensor film 6 in a direction perpendicular to the long side, and is bent in a direction perpendicular to the arrangement surface of the sensor film 6 at the base part 4*a* thereof so that the lead terminal 4 can be arranged to extend to the outside. Accordingly, a connecting portion that connects the second lead-out wires 15 in the base part 4*a* of the lead terminal 4 to the electrode patterns 13 and the first lead-out wires 63 are embedded in and sealed by the resin molded body 2. The lead terminal 4 is structured such that the second lead-out wires 15 are formed on a surface of the band-shaped base film portion 11*a* that extends from the sensor film 6. Terminal portions 15*a* provided at the distal ends of the second lead-out wires 15 are covered with a carbon ink layer 17 that protects contact portions of the second lead-out wires 15. The insulating overcoat layer 19 is formed on portions of the second lead-out wires 15 other than the terminal portions 15*a* to protect the second lead-out wires 15. A proximal end portion (in other words, a bent portion) of the overcoat layer 19 may be covered with the adhesive layer 18. A reinforcing plate 22 is fixed to the back surface of the band-shaped base film portion 11*a*, that is, the surface of the band-shaped base film portion 11*a* at the side opposite the terminal portions 15*a*. The reinforcing plate 22 and the terminal portions 15*a* form a connector that provides connection to an external device.

The pair of support wall portions 3 are formed integrally with the resin molded body 2 by, for example, injection molding so as to stand on the inner surface of the resin molded body 2 substantially perpendicularly to the inner surface. The support wall portions 3 support both end portions of the base part 4*a* of the lead terminal 4, which extends from the resin molded body 2, so that each end portion is retained in three directions, that is, from the front, back, and one side of the end portion. Thus, the lead terminal 4 can be positioned and securely fixed to the inner surface of the resin molded body 2. Even when a pulling force is applied to the lead terminal 4 for some reason, since the base part 4*a* of the lead terminal 4 is retained by the pair of support wall portions 3 and is therefore securely supported on the inner surface of the resin molded body 2, the lead terminal 4 can be reliably prevented from being pulled off the inner surface of the resin molded body 2. With regard to the dimensions of each support wall portion 3, when the thickness of the base part 4*a* of the lead terminal 4 is 0.2 mm, the thickness of each support wall portion 3 may be about 1 mm, and the dimension of a portion of the base part 4*a* covered by each support wall portion 3 in the width direction of the base part 4*a* may be about 0.5 mm. The height of each support wall portion 3 is preferably about 0.5 mm to 5 mm, and more practically about 1 mm to 2 mm. The present invention is not limited to these values.

An essential feature of the first embodiment is that the lead terminal 4 be supported by the pair of support wall portions 3, as illustrated in FIG. 1B. However, the lead terminal 4 can be more securely supported when a connecting wall portion 8 that connects the support wall portions 3 is formed integrally with the support wall portions 3. More specifically, as illustrated in FIGS. 1A and 1F, the connecting wall portion 8 that connects the support wall portions 3 and that is formed integrally with the inner surface of the resin molded body 2 so as to stand substantially perpendicularly to the inner surface may be additionally provided on the outer side of the pair of support wall portions 3. Thus, the outer surfaces of both end portions of the base part 4*a* of the lead terminal 4 in the width direction may be supported. In this case, not only can the end portions of the base part 4*a* of the lead terminal 4 be supported, but the outer surface of the base part 4*a* can be supported over the entire width thereof. Accordingly, the lead terminal 4 can be more securely supported on the resin molded body 2. In addition, the connecting portion between the sensor film 6, which is embedded in the resin molded body 2, and the base part 4*a* of the lead terminal 4 can be completely sealed by the pair of support wall portions 3 and the connecting wall portion 8. Also, a boundary portion that is not bonded to the resin molded body 2 can be sealed by the overcoat layer 19, which is provided to protect the first lead-out wires 63 that are bonded to the resin molded body 2 by the adhesive layer 18 and the second lead-out wires 15 that are connected to the first lead-out wires 63. Therefore, an insulation failure or an increase in resistance due to oxidation or sulfurization of silver particles, which are the main component of the second lead-out wires 15, or moisture, for example, can be prevented. The pair of support wall portions 3 and the connecting wall portion 8 may have the same height or different heights. Also, the pair of support wall portions 3 and the connecting wall portion 8 may have the same thickness or different thicknesses. The support wall portions 3 and the connecting wall portion 8 may be parts of erected portions of the resin molded body 2.

According to the first embodiment, both end portions of the base part 4a of the lead terminal 4 can be securely supported on the inner surface of the resin molded body 2 at least by the pair of support wall portions 3. The lead terminal 4 can be securely fixed to the inner surface of the resin molded body 2, and can be prevented from being separated from the base part 4a. As an actual example, the separation strength between the lead terminal 4 and the inner surface of the resin molded body 2 was 3 N/cm when the pair of support wall portions 3 was not provided, and was significantly increased to 30 N/cm or more when the pair of support wall portions 3 was provided. The boundary portion between the overcoat layer 19 and the adhesive layer 18, which is particularly easily separated from the resin molded body 2, is supported by the pair of support wall portions 3 formed integrally with the resin molded body 2, and the boundary portion and the connecting portion can be embedded in the resin molded body 2. Accordingly, the lead terminal 4 can be stably and securely retained so that separation thereof at the boundary portion is prevented and that the risk of conduction failure and increase in resistance at the connecting portion is reduced due to the sealing effect.

The present invention is not limited to the above-described embodiment, and various other embodiments are possible.

Figure 1E:
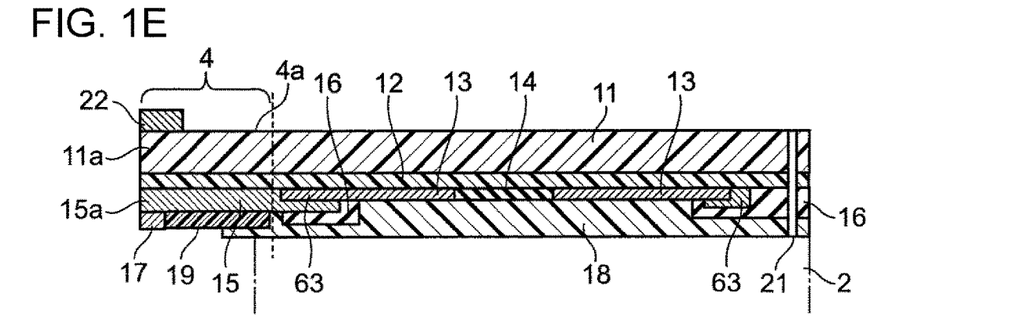
FIG. 1E is a sectional view of the sensor film included in the molding with an integrated electrode pattern.
Figure 1F:
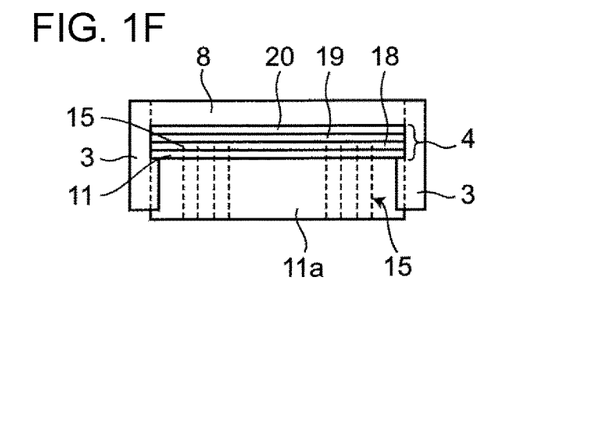
FIG. 1F is an enlarged plan view illustrating the structure of the molding with an integrated electrode pattern illustrated in FIG. 1A in the region around the pair of support walls.
Figure 1G:
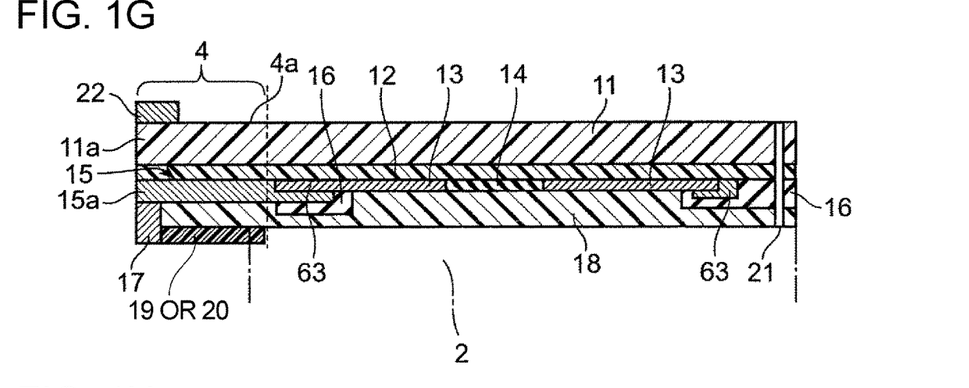
FIG. 1G is a sectional view of a sensor film included in a molding with an integrated electrode pattern according to a first modification of the first embodiment.

For example, in the sectional view of the sensor film 6 and the lead terminal 4 illustrated in FIG. 1E, the insulating overcoat layer 19 is formed on portions of the second lead-out wires 15 other than the terminal portions 15a to protect the second lead-out wires 15. Alternatively, as illustrated in FIG. 1G, the adhesive layer 18 may be formed on the portions of the second lead-out wires 15 other than the terminal portions 15a, and then the insulating overcoat layer 19 may be formed on the adhesive layer 18 that covers the second lead-out wires 15. In addition, an adhesive insulating reinforcing film 20 may be bonded to the overcoat layer 19.

Figure 1H:
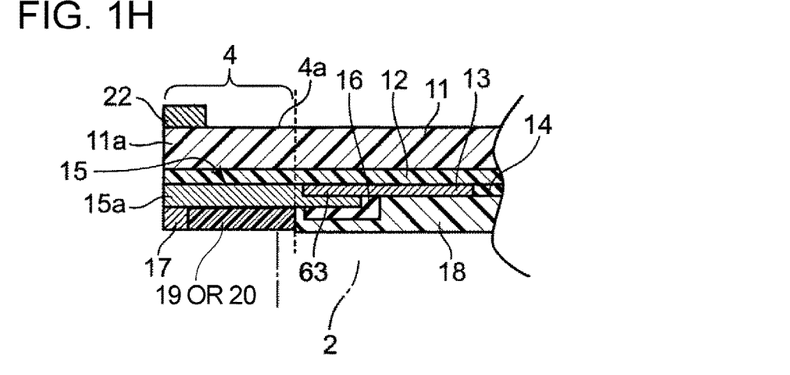
FIG. 1H is a sectional view of a sensor film included in a molding with an integrated electrode pattern according to a second modification of the first embodiment, illustrating the region around a lead terminal.
Figure 1I:
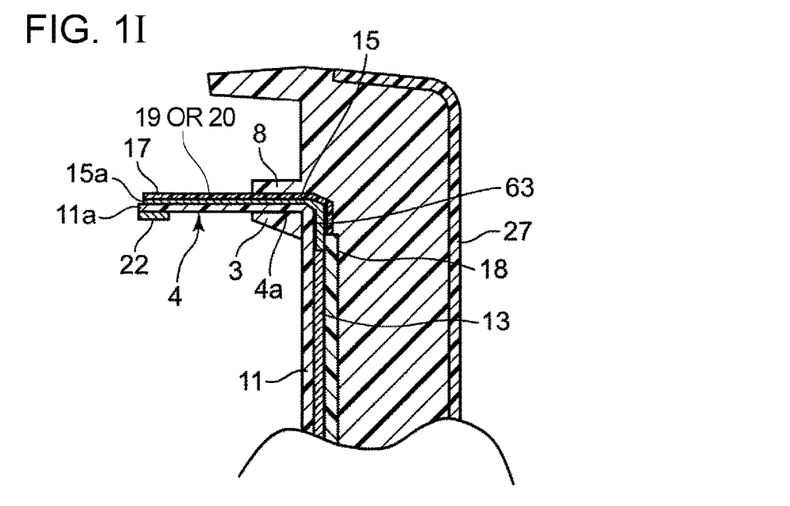
FIG. 1I is a sectional view of the sensor film included in the molding with an integrated electrode pattern according to the second modification of the first embodiment taken along line C-C in FIG. 1A.

Alternatively, as illustrated in FIGS. 1H and 1I, the insulating overcoat layer 19 or the insulating reinforcing film 20 may be formed on the portions of the second lead-out wires 15 other than the terminal portions 15a so that the adhesive layer 18 is adjacent thereto and does not cover the proximal end portion (in other words, the bent portion) of the overcoat layer 19 provided to protect the second lead-out wires 15.

Figure 2:
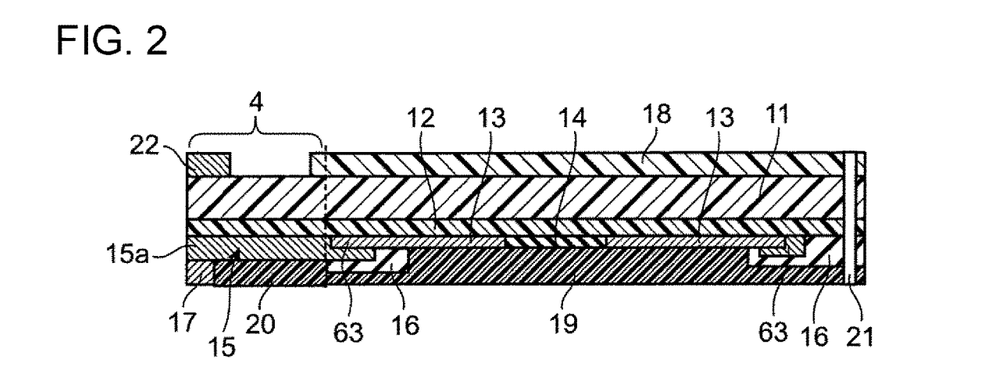
FIG. 2 is a sectional view of a sensor film included in a molding with an integrated electrode pattern according to a second embodiment of the present invention.

Referring to FIG. 2, which illustrates a molding with an integrated electrode pattern according to a second embodiment of the present invention, the adhesive layer 18, which is bonded to the resin molded body 2, may be formed directly on the base film 11 instead of being disposed at the side opposite the base film 11 as illustrated in FIG. 1E. In this case, to prevent the electrode patterns 13 and the first lead-out wires 63 from being exposed on the inner surface of the resin molded body 2, the insulating overcoat layer 19 is formed at least over the entire area including the electrode patterns 13 and the first lead-out wires 63. More specifically, to protect the entire circuit, the insulating overcoat layer 19 is formed over the entire area of the inner surface of the sensor film 6 including the electrode patterns 13, the first lead-out wires 63, and the frame pattern 14 except for the area in which terminal portions 15a at the distal end of the lead terminal 4 are formed. In addition, the adhesive insulating reinforcing film 20 is formed on portions of the second lead-out wires 15 other than the terminal portions 15a to protect the second lead-out wires 15. In this structure, the adhesive reinforcing film 20 having a thickness of 15 to 50 μm is provided instead of the overcoat layer 19 having a thickness of 5 to 10 μm, and therefore the second lead-out wires 15 are more effectively protected.

When the insulating reinforcing film 20 (for example, adhesive polyimide film or PET film) is formed on the adhesive layer, the boundary portion between the region in which the adhesive layer on the lead terminal 4 is exposed and the region in which the adhesive layer is covered with the reinforcing film 20 can be sealed by the support wall portions 3 and the connecting wall portion 8. In addition, the risk that the base film 11 will be torn from the base part 4a of the lead terminal 4 can be reduced, and the occurrence of damage or breakage of the second lead-out wires 15 can be significantly reduced.

Figure 3:
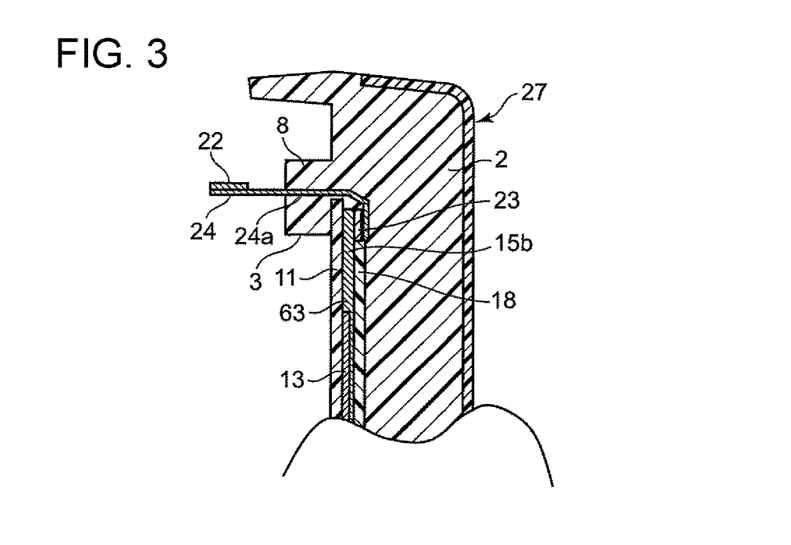
FIG. 3 is a sectional view of a molding with an integrated electrode pattern according to a third embodiment.

Referring to FIG. 3, which illustrates a molding with an integrated electrode pattern according to a third embodiment of the present invention, the lead terminal is not limited to the lead terminal 4 formed integrally with the sensor film 6, and may instead be a lead terminal formed separately from the sensor film 6, for example, a flexible printed circuit (FPC) 24. The FPC 24, which is band-shaped, is electrically connected to connecting end portions 15b of the first lead-out wires 63 at one long side of the substantially rectangular sensor film 6 by an anisotropic conductive adhesive, such as ACF or ACP (hereinafter referred to simply as ACF) 23.

Similar to the first embodiment, the pair of support wall portions 3 are formed integrally with the resin molded body 2 by, for example, injection molding so as to stand on the inner surface of the resin molded body 2 substantially perpendicularly to the inner surface. The support wall portions 3 support both end portions of a base part 24a of the band-shaped FPC 24, which is connected to the resin molded body 2, so that each end portion is retained in three directions, that is, from the front, back, and one side of the end portion. Thus, the FPC 24 can be positioned and securely fixed to the inner surface of the resin molded body 2. Even when a pulling force is applied to the FPC 24 for some reason, since the base part 24a of the FPC 24 is retained by the pair of support wall portions 3 and is therefore securely supported on the resin molded body 2, the FPC 24 can be reliably prevented from being pulled off the inner surface of the resin molded body 2.

In the above-described structure, the pair of support wall portions 3 support both end portions of the FPC 24 while the pressure-bonded portion in which the first lead-out wires 63 and the FPC 24 are bonded together by the ACF 23 is embedded in the resin molded body 2 and is sealed. Accordingly, an increase in resistance due to, for example, oxidation or sulfurization caused by external air or moisture can be prevented at the pressure-bonded portion.

Figure 4A:
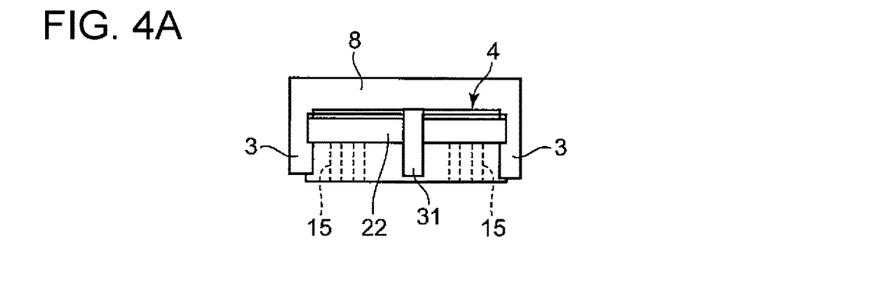
FIG. 4A is an enlarged plan view illustrating the structure of a molding with an integrated electrode pattern according to a fourth embodiment of the present invention in the region around a pair of support walls.
Figure 4B:
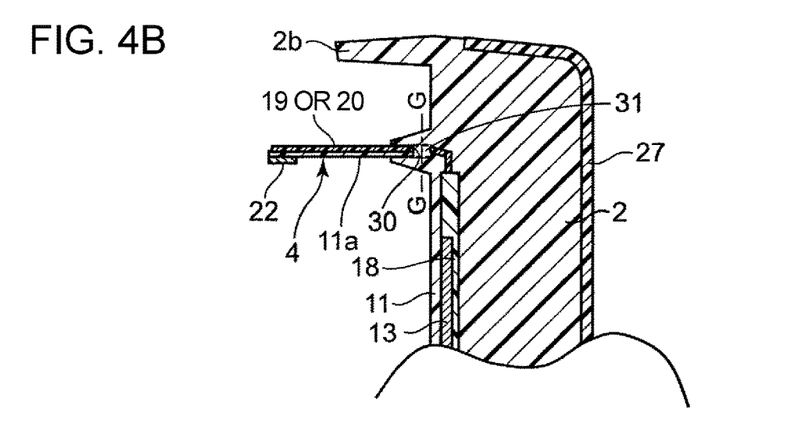
FIG. 4B is a partial sectional view of the molding with an integrated electrode pattern according to the fourth embodiment.
Figure 4C:
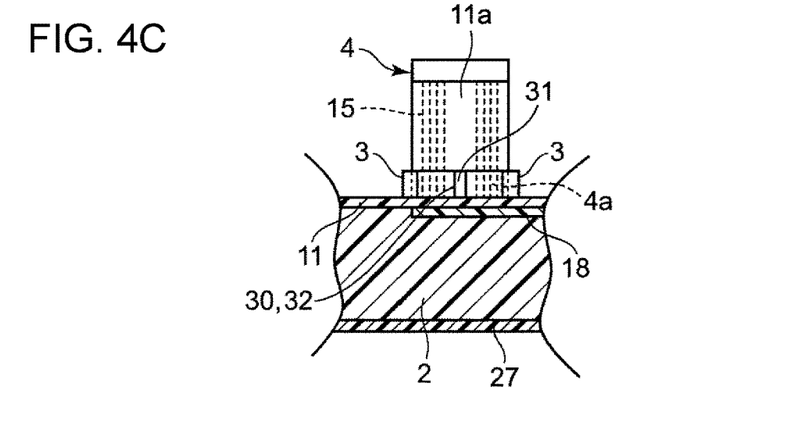
FIG. 4C is partial sectional view of the molding with an integrated electrode pattern according to the fourth embodiment viewed from the front.

Referring to FIG. 4C, which illustrates a molding with an integrated electrode pattern according to a fourth embodiment of the present invention, an intermediate rib 31, which serves as an intermediate support portion, may be additionally provided at an intermediate position between the pair of support wall portions 3. The intermediate rib 31 is formed integrally with the resin molded body 2 so as to stand on the resin molded body 2 by causing molten resin to pass through a through hole 30 having a certain width formed in the lead terminal 4. The intermediate rib 31 supports a portion of the lead terminal 4 around the through hole 30. More specifically, the through hole 30, which has a certain width, is formed in the base part 4a of the band-shaped lead terminal 4 at the center in the width direction. Accordingly, in the injection molding process, the molten resin passes through the through hole 30 and spreads along the front and back surfaces of the base part 4a of the lead terminal 4 in the region around the through hole 30. Thus, the intermediate rib 31, which clamps the base part 4a of the lead terminal 4 at the front and back surfaces thereof, is formed as an example of an intermediate support portion. In this case, the base part 4a of the lead terminal 4 can be supported not only at both end portions thereof but also at an intermediate portion thereof, and can therefore be more securely and stably supported. When the molten resin passes through the through hole 30, the intermediate rib 31 can be formed to have a width and a length greater than those of the through hole 30.

Instead of the through hole 30 having a certain width, a slit 32 (see, for example, FIG. 4D), which is a simple cut (in other words, a through hole whose opening width is zero), may be formed at an intermediate position near the base end 4a of the lead terminal 4. Also in this case, similar to the case where the through hole 30 is formed, the molten resin passes through the slit 32 and spreads over a region around the slit 32 in the injection molding process, so that the intermediate rib 31 can be formed in a similar manner. When the molten resin passes through the slit 32, the intermediate rib 31 can be formed to have a width and a length greater than those of the slit 32.

Figure 4D:
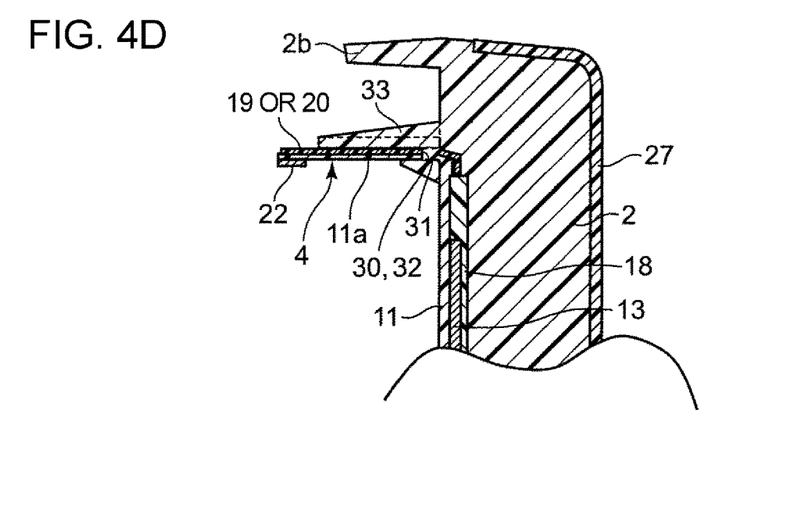
FIG. 4D is a sectional view of a molding with an integrated electrode pattern according to another modification of the fourth embodiment.
Figure 4E:
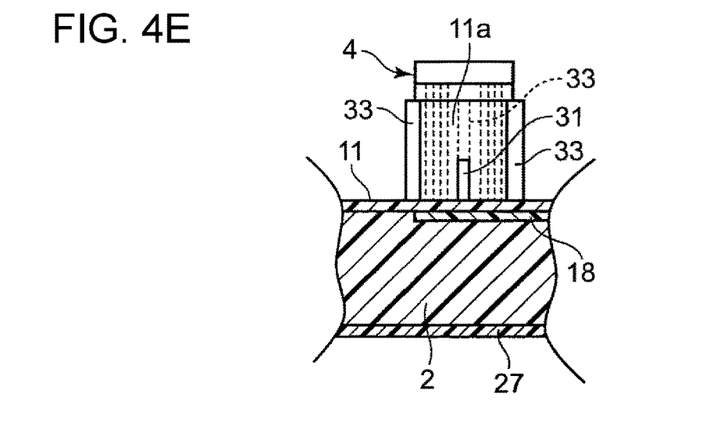
FIG. 4E is a partial sectional view of the molding with an integrated electrode pattern according to the other modification of the fourth embodiment viewed from the front.

As illustrated in FIGS. 4D and 4E, the support wall portions 3 and the intermediate rib 31 may be formed to extend to a position close to the distal end of the lead terminal 4 in a longitudinal direction. According to this structure, the lead terminal 4 can be clamped by vertically long rib wall portions 33 at the front and back surfaces thereof. Thus, the heights of the support wall portions 3 and the intermediate rib 31 can be increased. Accordingly, even when, for example, the lead terminal 4 is a flexible film or an FPC, the lead terminal 4 can be stably supported by the vertically long rib wall portions 33 so as to somewhat firmly stand on the inner surface of the resin molded body 2, and can be easily connected to an external device.

Figure 4F:
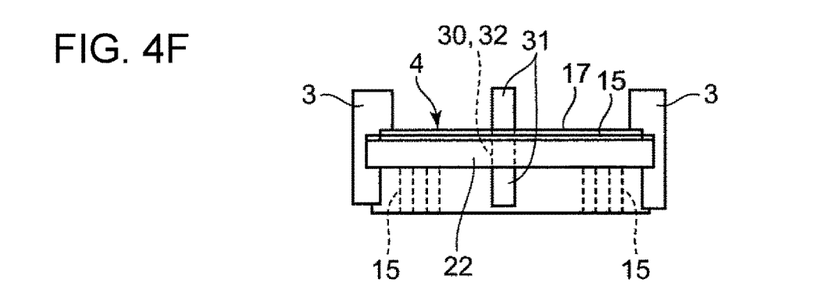
FIG. 4F is an enlarged plan view illustrating the structure of a molding with an integrated electrode pattern according to another modification of the fourth embodiment in the region around a pair of support walls.

As illustrated in FIG. 4F, the structure may instead be such that the connecting wall portion 8 is omitted and only the pair of support wall portions 3 and the intermediate rib 31 are provided.

Figure 4G:
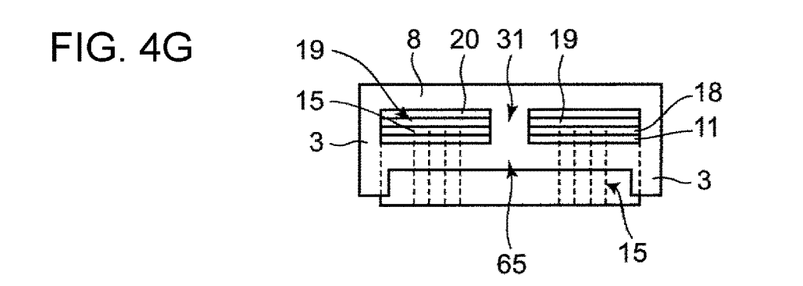
FIG. 4G is an enlarged plan view illustrating the structure of a molding with an integrated electrode pattern according to another modification of the fourth embodiment in the region around a pair of support walls.

Alternatively, as illustrated in FIG. 4G, in addition to the pair of support wall portions 3 and the connecting wall portion 8, an auxiliary connecting wall portion 65 may be additionally provided between the pair of support wall portions 3 at the side of the lead terminal 4 (or FPC 24) opposite the connecting wall portion 8. Thus, the lead terminal 4 (or FPC 24) may be surrounded at four sides thereof, in other words, at the entire periphery thereof. According to this structure, resistance to the inward pulling force applied to the lead terminal 4 can be significantly increased. In addition, the boundary portion between the first lead-out wires 63 and the second lead-out wires 13 and the pressure-bonded portion between the first lead-out wires 63 and the FPC 24 can be completely sealed.

Figure 4H:
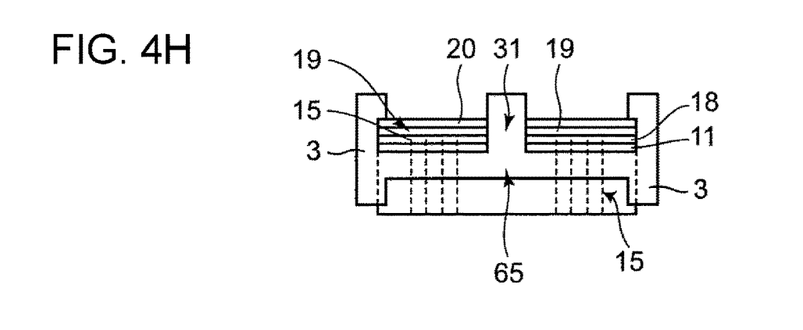
FIG. 4H is an enlarged plan view illustrating the structure of a molding with an integrated electrode pattern according to another modification of the fourth embodiment in the region around a pair of support walls.

Alternatively, as illustrated in FIG. 4H, the connecting wall portion 8 may be omitted in the modification illustrated in FIG. 4G, and the lead terminal 4 (or FPC 24) may be supported and fixed at three sides thereof by the pair of support wall portions 3, the intermediate rib 31, and the auxiliary connecting wall portion 65. The auxiliary connecting wall portion 65 is formed integrally with the inner surface of the resin molded body 2 so as to stand on the inner surface. The auxiliary connecting wall portion 65 connects the pair of support wall portions 3 at a side of the base part 4a of the lead terminal 4 adjacent to the sensor film, and is connected to the intermediate rib 31. In this case, the lead terminal 4 can be particularly effectively prevented from being separated when an inward pulling force is applied thereto.

Figure 5:
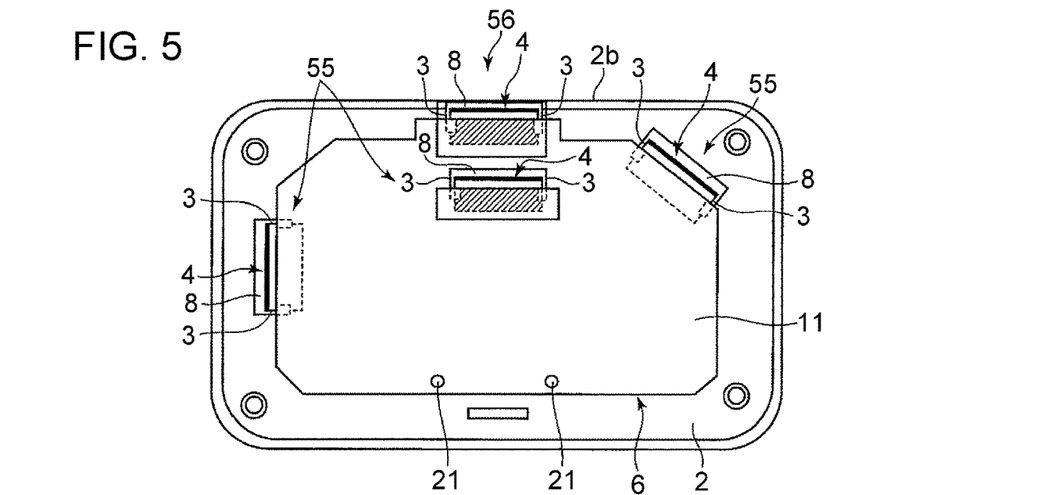
FIG. 5 is a plan view illustrating examples of arrangements of a lead terminal in each of the moldings with an integrated electrode pattern according to the embodiments of the present invention.

FIG. 5 illustrates examples of arrangements of the lead terminal 4 (or FPC 24). The position of the lead terminal 4 (or FPC 24) is not limited to positions 55 near a long side or a short side of the inner surface of the resin molded body 2, and may be a position 56 at an edge of a long side or a short side. In such a case, the connecting wall portion 8 may also function as an edge portion 2b (see FIGS. 10 and 5) of the resin molded body 2.

A method for manufacturing each of the moldings with an integrated electrode pattern according to the embodiments will be described with reference to FIG. 6A to FIG. 7B.

First, a pair of injection molding dies 41 and 42 used in the manufacturing method will be described.

Figure 6A:
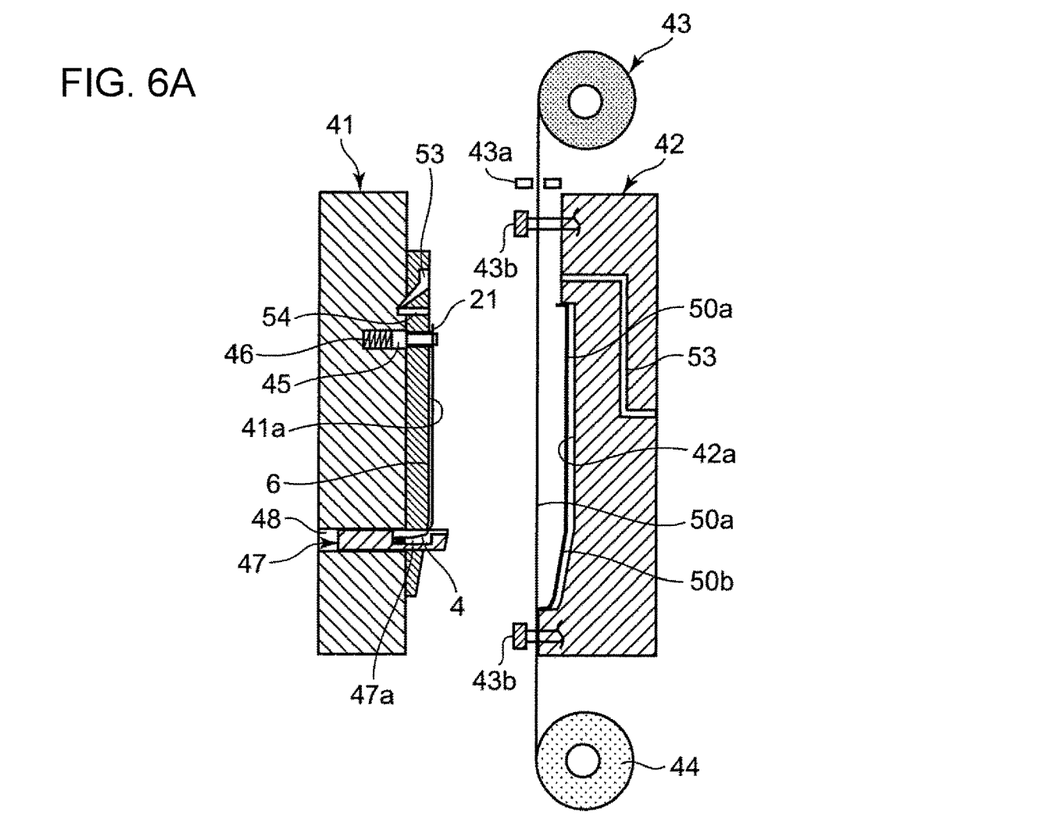
FIG. 6A is a vertical sectional view illustrating a pair of dies used to manufacture each of the moldings with an integrated electrode pattern according to the embodiments of the present invention in an open state.

The pair of injection molding dies 41 and 42 include a first injection molding die 41 and a second injection molding die 42. The first injection molding die 41 includes a plurality of positioning pins 45 that are urged to project outward from a first cavity forming surface 41a by springs 46. The positioning pins 45 can be fitted to the positioning through holes 21 in the sensor film 6 to position the sensor film 6 with respect to the first cavity forming surface 41a of the first injection molding die 41. The first injection molding die 41 also has a sliding-pin installation hole 48 at a position where the band-shaped lead terminal 4 of the sensor film 6 or the FPC 24 (hereinafter referred to simply as the lead terminal 4) is positioned. A sliding pin 47, which has a lead-terminal receiving recess 47a, is placed in the sliding-pin installation hole 48. The injection molding process is performed after placing the sliding pin 47 so that the sliding pin 47 projects from the first injection molding die 41 to expose the lead-terminal receiving recess 47a, placing the lead terminal 4 in the lead-terminal receiving recess 47a, and returning the sliding pin 47 to a certain position.

Figure 7A:
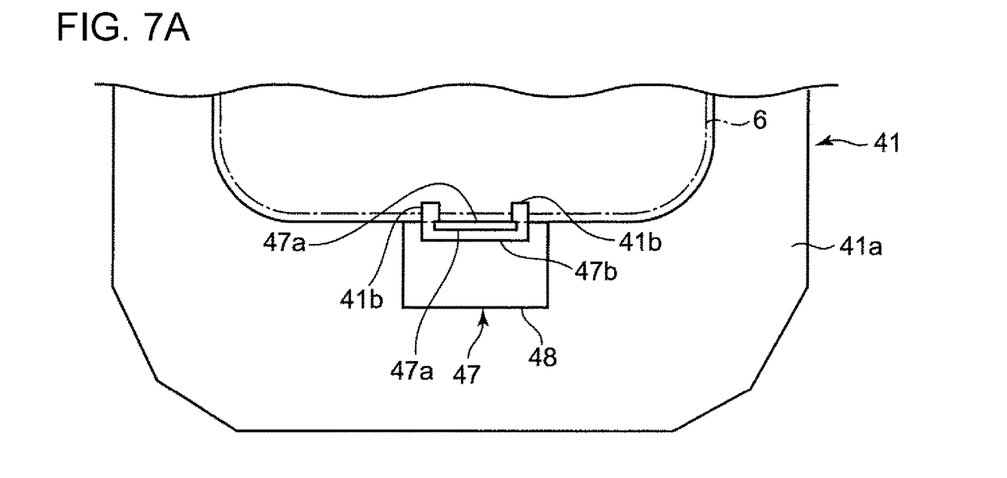
FIG. 7A is an enlarged plan view of a portion of the first injection molding die, which is one of the dies illustrated in FIG. 6A, illustrating the region around a sliding pin.
Figure 7B:
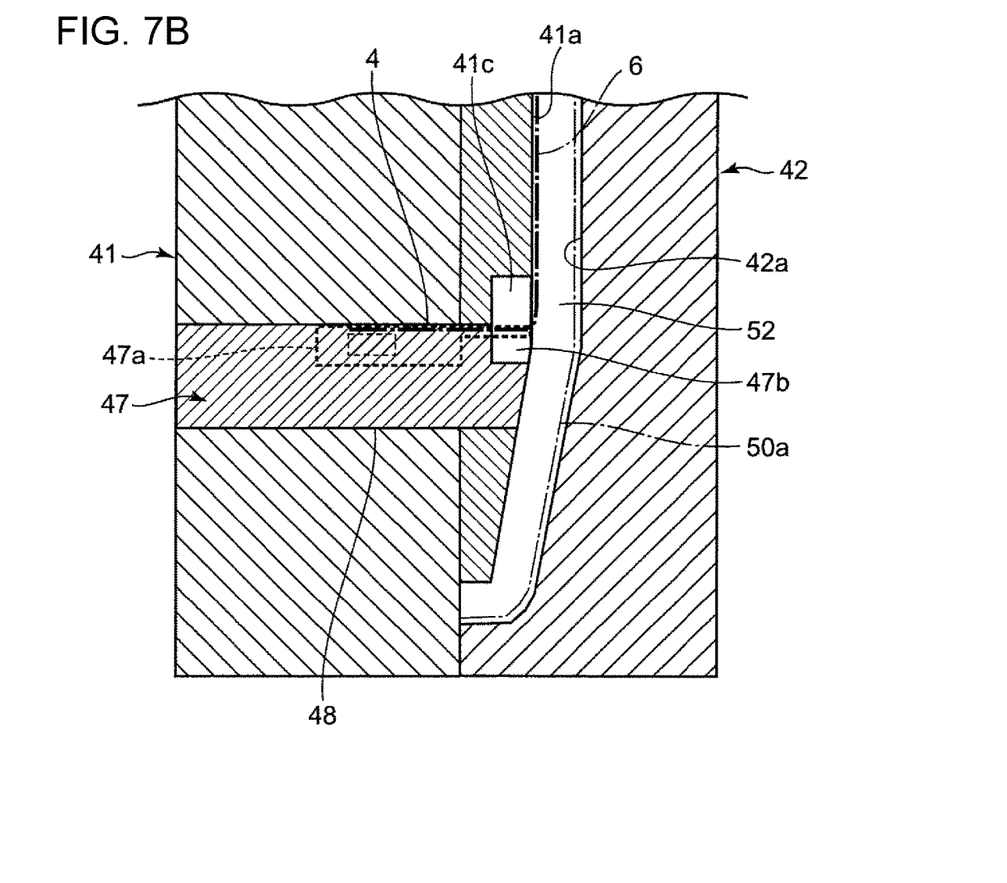
FIG. 7B is an enlarged sectional view of a portion of the first injection molding die, which is one of the dies illustrated in FIG. 6A, illustrating the region around the sliding pin.

As illustrated in FIGS. 7A and 7B, inner-wall recesses 41b and an outer-wall recess 47b for forming the pair of support wall portions 3 and the connecting wall portion 8 are formed in the sliding pin 47 and a portion of the first injection molding die 41 around the sliding pin 47. The pair of support wall portions 3 can be formed by the inner-wall recesses 41b and the outer-wall recess 47b, and the connecting wall portion 8 can be formed by the outer-wall recess 47b.

A decoration film for decorating one surface of the resin molded body 2 is provided on a second cavity forming surface 42a. The decoration film may be either an insert molding decoration film 50b, with which a base film 11 and a graphic pattern layer printed on the base film 11 are both integrated with the molded resin, or a molding transfer decoration film 50a, with which only the graphic pattern layer printed on the base film 11 is transferred to the molded resin and the base film 11 is removed after the injection molding process. Also, the decoration film may be either a sheet-shaped film obtained by cutting a continuous film into individual pieces in advance or a roll film that is wound around a paper tube. When, for example, a sheet-shaped insert molding decoration film 50b is used, the insert molding decoration film 50b is positioned with respect to the second cavity forming surface 42a by using a robot or the like, and is fixed by air suction or by using a positioning pin. When a roll film is used, a dedicated film feeding device may be used. In such a case, the molding transfer decoration film 50a, which is wound around a let-off roller, may be positioned with respect to the second cavity forming surface 42a by using a positioning mark detection sensor 43a, and fixed by a film clamp 43b.

Each of the moldings with an integrated electrode pattern according to the embodiments may be manufactured by using the pair of injection molding dies 41 and 42 as described below.

In this manufacturing method, first, the first injection molding die 41 and the second injection molding die 42 are opened and the sliding pin 47 is placed so as to project from the first injection molding die 41. Then, the lead terminal 4 of the sensor film 6 is placed in the sliding pin 47, and the sliding pin 47 is retracted to a certain position.

A design film that is formed and trimmed in advance is inserted onto the second cavity forming surface 42a of the second injection molding die 42 as necessary.

Figure 6B:
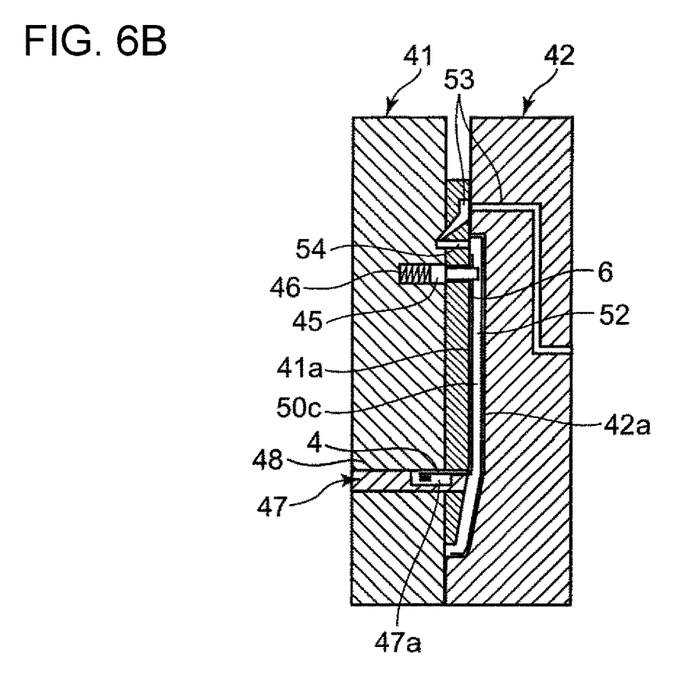
FIG. 6B is a vertical sectional view illustrating the pair of dies illustrated in FIG. 6A in a clamped state.

After that, the dies 41 and 42 are closed and molten resin is injected to form the resin molded body 2, which has a design pattern on one surface thereof and an electrostatic sensor function on the other surface thereof.

This will be described in detail below.

Figure 6C:
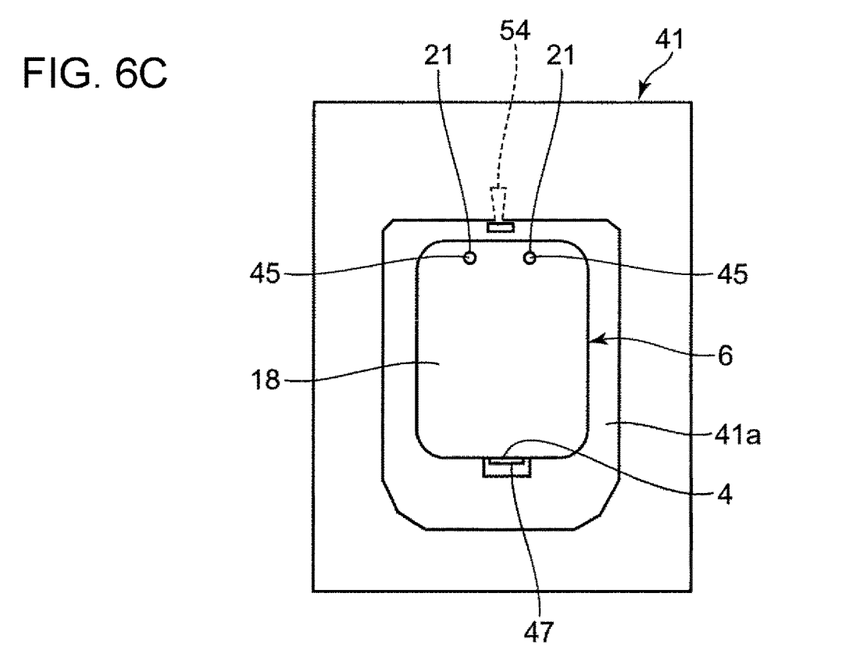
FIG. 6C is a front view of a first injection molding die, which is one of the dies illustrated in FIG. 6A, in a state such that a sensor film is placed thereon.

First, the sensor film 6 is positioned on the first cavity forming surface 41a of the first injection molding die 41 by using the positioning pins 45, and the sliding pin 47 is placed so that the distal end thereof projects from the sliding-pin installation hole 48. Then, the lead terminal 4 of the sensor film 6 is placed in the lead-terminal receiving recess 47a in the sliding pin 47, and the sliding pin 47 is returned to a certain position in the sliding-pin installation hole 48. Also, a film on which a design pattern is printed is inserted onto the second cavity forming surface 42a of the second injection molding die 42.

Next, the first injection molding die 41 and the second injection molding die 42 are clamped together, and molten resin is injected into the cavity 52 through a runner 53 and a gate 54. As a result, the molten resin fills the inner-wall recesses 41b and the outer-wall recess 47b to form the pair of support wall portions 3 on both end portions of the base part 4a of the lead terminal 4, and fills the outer-wall recess 47b to form the connecting wall portion 8 integrally with the pair of support wall portions 3 on the outer surface of the base part 4a of the lead terminal 4 between the end portions thereof.

Next, after a cooling process, the first injection molding die 41 and the second injection molding die 42 are opened and the sliding pin 47 is placed so that the distal end thereof projects from the sliding-pin installation hole 48. Then, the molding 1 with an integrated electrode pattern, in which the lead terminal 4 is formed integrally with the resin molded body 2 so as to stand on the resin molded body 2, is removed from the dies.

According to the above-described manufacturing method, each of the moldings 1 with an integrated electrode pattern according to the above-described embodiments can be reliably manufactured.

The above-described embodiments and modifications may be applied in any combination to obtain the effects thereof. The combination may be a combination of embodiments, a combination of examples, or a combination of embodiments and examples. Also, features of different embodiments or examples may also be applied in combination.

INDUSTRIAL APPLICABILITY

According to a molding with an integrated electrode pattern and a method for manufacturing the molding with an integrated electrode pattern of the present invention, the lead terminal can be securely fixed to the inner surface of the resin molded body. The molding with an integrated electrode pattern is suitable for use in, for example, a display panel of an electric home appliance, such as an automatic rice cooker, an air cleaner, a washing machine, or a refrigerator, or household equipment, a vehicle-mounted audio or air-conditioning device, an operation panel or a remote control of any type of household appliance, or a display of a game device.

REFERENCE SIGNS LIST 1 molding with integrated electrode pattern
2 resin molded body
2b edge portion
3 support wall portion
4 second film (lead terminal)
4a base part
4b one end portion
6 sensor film
8 connecting wall portion
11 base film
11a band-shaped base film portion
12 primer layer
13 electrode pattern
14 frame pattern
15 second lead-out wire
15a terminal portion
15b connecting end portion
16 graphic layer
17 carbon ink layer
18 adhesive layer
19 overcoat layer
20 reinforcing film
21 positioning through hole
22 reinforcing plate
23 ACF or ACP
24 FPC
24a base part
27 design film
30 through hole
31 intermediate rib
32 slit
33 vertically long rib wall portion
41 first injection molding die
41a first cavity forming surface
41b inner-wall recess
42 second injection molding die
42a second cavity forming surface
43 let-off roller
43a positioning mark detection sensor
43b film clamp
44 take-up roller
45 positioning pin
46 spring
47 sliding pin
47a lead-terminal receiving recess
47b outer-wall recess
48 sliding-pin installation holes
50 simultaneous molding decoration film
50a molding transfer decoration film
50b insert molding decoration film
50c simultaneous molding decoration portion
52 cavity
53 runner
54 gate 55 position near long side or short side
56 position at edge of long side or short side
63 first lead-out wire
65 auxiliary connecting wall portion

The invention claimed is:

1. A molding with an integrated electrode pattern, comprising:
a resin molded body having a first surface and a second surface opposing each other;
a first film that is formed on the first surface of the resin molded body and that includes an electrode pattern and a first lead-out wire electrically connected to the electrode pattern, the first film not being covered by the resin molded body; and
a second film that stands vertically or substantially vertical on the first surface of the resin molded body, and that includes a second lead-out wire electrically connected to the first lead-out wire, the second film having a rectangular shape,
wherein the resin molded body includes a pair of support wall portions formed integrally with the first surface of the resin molded body so as to stand vertically or substantially vertical on the first surface of the molded body and clamp both ends of a base part of the second film.

2. The molding with an integrated electrode pattern according to claim 1, wherein the resin molded body further includes a connecting wall portion formed integrally with the first surface of the resin molded body so as to stand on the first surface of the resin molded body and support the second film, the connecting wall portion connecting the pair of support wall portions at a side of the base part of the second film opposite the first film.

3. The molding with an integrated electrode pattern according to claim 1, wherein the base part of the second film has a through hole, and
wherein the resin molded body further includes an intermediate support portion formed integrally with the first surface of the resin molded body so as to stand on the first surface of the resin molded body, the intermediate support portion extending through the through hole at an intermediate position between the pair of support wall portions.

4. The molding with an integrated electrode pattern according to claim 3, wherein the resin molded body further includes an auxiliary connecting wall portion that is connected to the pair of support wall portions and the intermediate support portion and disposed so as to oppose the connecting wall portion with the base part of the second film interposed therebetween, and wherein an entire periphery of the base part of the second film is surrounded by the pair of support wall portions, the connecting wall portion, and the auxiliary connecting wall portion.

5. The molding with an integrated electrode pattern according to claim 1, wherein the first film and the second film constitute a single film.

6. The molding with an integrated electrode pattern according to claim 1, wherein the base part of the second film has a through hole, and
wherein the resin molded body further includes
an intermediate support portion formed integrally with the first surface of the resin molded body so as to stand vertically or substantially vertical on the first surface of the resin molded body, the intermediate support portion extending through the through hole in the second film at an intermediate position between the pair of support wall portions, and
an auxiliary connecting wall portion formed integrally with the first surface of the resin molded body so as to stand vertically or substantially vertical on the first surface of the resin molded body, the auxiliary connecting wall portion connecting the pair of support wall portions at a side of the base part of the second film adjacent to the first film and being connected to the intermediate support portion.

7. The molding with an integrated electrode pattern according to claim 1, further comprising:
an insulating reinforcing film that covers the second lead-out wire of the second film.

8. The molding with an integrated electrode pattern according to Claim 1, wherein
the first film is a sensor film, and
the second film is a lead terminal of the sensor film.

* * * * *